(12) United States Patent
Zhou et al.

(10) Patent No.: US 11,294,781 B2
(45) Date of Patent: Apr. 5, 2022

(54) MEMORY DEVICE AND REDUNDANCY METHOD APPLIED THERETO

(71) Applicant: RayMX Microelectronics, Corp., Anhui province (CN)

(72) Inventors: Yufeng Zhou, Jiangsu Province (CN); Shuangxi Chen, Jiangsu Province (CN)

(73) Assignee: RAYMX MICROELECTRONICS, CORP., Anhui Province (CN)

( * ) Notice: Subject to any disclaimer, the term of this patent is extended or adjusted under 35 U.S.C. 154(b) by 288 days.

(21) Appl. No.: 16/793,059

(22) Filed: Feb. 18, 2020

(65) Prior Publication Data
US 2021/0173751 A1    Jun. 10, 2021

(30) Foreign Application Priority Data

Dec. 6, 2019    (CN) ......................... 201911243872.X

(51) Int. Cl.
| | | |
|---|---|---|
| *G06F 11/08* | (2006.01) | |
| *G06F 11/20* | (2006.01) | |
| *G06F 12/0815* | (2016.01) | |
| *G11C 16/04* | (2006.01) | |

(52) U.S. Cl.
CPC ...... *G06F 11/2094* (2013.01); *G06F 12/0815* (2013.01); *G06F 2201/82* (2013.01); *G06F 2212/1032* (2013.01); *G11C 16/0483* (2013.01); *G11C 2216/14* (2013.01)

(58) Field of Classification Search
CPC .......................... G06F 11/2094; G06F 12/0815
USPC .................................................. 714/6.23, 6.24
See application file for complete search history.

(56) References Cited

U.S. PATENT DOCUMENTS

| | | | | |
|---|---|---|---|---|
| 2002/0133735 | A1* | 9/2002 | McKean | G06F 11/2092 |
| | | | | 714/5.11 |
| 2010/0125695 | A1* | 5/2010 | Wu | G06F 3/0656 |
| | | | | 711/103 |
| 2013/0290777 | A1* | 10/2013 | Yoshihara | G06F 11/108 |
| | | | | 714/15 |
| 2014/0181620 | A1* | 6/2014 | Kotzur | G06F 11/1068 |
| | | | | 714/764 |
| 2015/0058537 | A1* | 2/2015 | Shen | G06F 11/108 |
| | | | | 711/103 |
| 2017/0236568 | A1* | 8/2017 | Rho | G11C 7/02 |
| | | | | 711/105 |

(Continued)

*Primary Examiner* — Chae M Ko
(74) *Attorney, Agent, or Firm* — McClure, Qualey & Rodack, LLP

(57) ABSTRACT

The present disclosure provides a redundancy method for a flash memory device. The flash memory device comprises multiple storage areas in which at least one storage area is configured as a temporary storage area for redundant operations. The method comprises: performing redundant operations to a first set of pages stored in one of the plurality of storage areas in a cache to generate an intermediate result; storing the intermediate result to the storage area of the at least one temporary storage area for redundant operation from the cache; performing redundant operations to the (m+1)th set of pages stored in one storage area the redundant operation result of and the first set of pages stored in the at least one temporary storage area for redundant operation to produce a final result in the cache; storing the final result to the corresponding pages in the (m+1)th set of pages from the cache.

15 Claims, 5 Drawing Sheets

(56) References Cited

U.S. PATENT DOCUMENTS

2017/0315867 A1* 11/2017 Yang ..................... G06F 3/064
2017/0315909 A1* 11/2017 Yang ..................... G11C 29/42

* cited by examiner

MEMORY DEVICE AND REDUNDANCY METHOD APPLIED THERETO

CROSS REFERENCE TO RELATED APPLICATION

This application claims the priority benefit of Chinese Patent Application Serial Number 201911243872.X, filed on Dec. 6, 2019, the full disclosure of which is incorporated herein by reference.

BACKGROUND

Technical Field

The present disclosure relates to the technical field of memory devices, and more particularly to a flash memory device and the redundancy method applied thereto.

Related Art

Redundant Array of Independent Disks (RAID), formerly known as Redundant Array of Inexpensive Disks, referred to as disk array, is a data storage virtualization technology for the purposes of data redundancy, performance improvement, or both, RAID can be widely used in storage technologies such as solid-state disks (SSD), pen-drives, and secure digital (SD) digital memory cards. The realization of RAID is to process the stored data to generate redundant data then save both the original and the redundant data. In case of data error, other data and redundant data would be inversely calculated together to obtain the required data. Because this process requires a lot of memory to cache the data increasing the implementation cost.

A prior art of current RAID is typically realized as follows. The cached data is written to the flash memory array after being processed by the RAID engine, and the operated redundant data would also be written to the flash memory array. However, in storage devices, adjacent multiple pages in a flash memory (e.g., NAND memory) are easily damaged simultaneously due to some physical characteristics of flash memory. This will exceed the error correction capability of redundant data and make it impossible to recover data. Therefore, multiple pages are generally spaced to perform data redundant operations.

On the other hand, the programming of flash memory (e.g., NAND memory) must be performed in page order. So, a large static random access memory (SRAM) is needed to buffer the intermediate page data. Take 4 pages at intervals (e.g., page 0 and page 4) for data redundant operation as an example, data is written to the NAND memory, which is sequentially written to page 0, page 1, page 2, page 3, page 4, page 5 of the NAND memory. Because the data to be written to Page 0 and the data to be written to Page 4 need to be redundantly calculated, the data written to Page 0 temporarily stored in SRAM at this time cannot be released, and must continue to be stored in SRAM, only After data written to Page 4 is programmed into NAND memory, the data written to Page 0 temporarily stored in the SRAM can be released. Therefore, this above method will require the SRAM with at least 4 pages data capacity as a cache. When multiple channels operate in parallel, the required SRAM cache would be multiplied. When the number of pages that need to be spaced increases, the corresponding SRAM caches also increase. When the number of interval pages needs to be increased for data redundant operations, the corresponding SRAM caches would also increase. However, the SRAM capacity in the flash storage device is fixed after production, so that the flash storage device cannot support more interval page data redundant operations.

SUMMARY

In view of this, the disclosure provides a method and a device to solve the disadvantages in the prior art.

The embodiments of the present disclosure provide a redundancy method for a flash memory device, comprising a plurality of storage areas in which at least one storage area is configured as a temporary storage area for redundant operations. The redundancy method comprises: performing redundant operations to a first set of pages stored in one of the plurality of storage areas in a cache to generate an intermediate result of the redundant operation; storing the intermediate result of the redundant operation to the storage area of the at least one temporary storage area for redundant operation from the cache; performing redundant operations to the (m+1)th set of pages stored in one of the plurality of storage areas and the redundant operation result of the first set of pages stored in the at least one temporary storage area for redundant operation to produce a final result of redundant operations in the cache; storing the final result of the redundant operation to the corresponding pages in the (m+1)th set of pages from the cache.

The embodiments of the present disclosure provide a flash memory device, comprising a cache, a non-volatile memory comprising multiple storage areas, wherein at least one multiple storage areas is configured as a temporary storage area for redundant operations, a processor coupled to the non-volatile memory, wherein the processor: performs redundant operations to a first set of pages stored in one of the plurality of storage areas in the cache to generate an intermediate result of the redundant operation; stores the intermediate result of the redundant operation to the storage area of the at least one temporary storage area for redundant operation from the cache; performs redundant operations to the (m+1)th set of pages stored in one of the plurality of storage areas and the redundant operation result of the first set of pages stored in the at least one temporary storage area for redundant operation to produce a final result of redundant operations in the cache; stores the final result of the redundant operation to the corresponding pages in the (m+1)th set of pages from the cache.

The present disclosure provides a flash memory device and redundancy method applied thereto, which uses NAND as an intermediate buffer, so there is no need to cache a large amount of data during the RAID operation, reducing the use of internal memory (SRAM) with data recovery capabilities, thereby greatly reducing the cost of implementing RAID. In addition, the disclosure could also support the algorithm spacing any number of pages apart.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
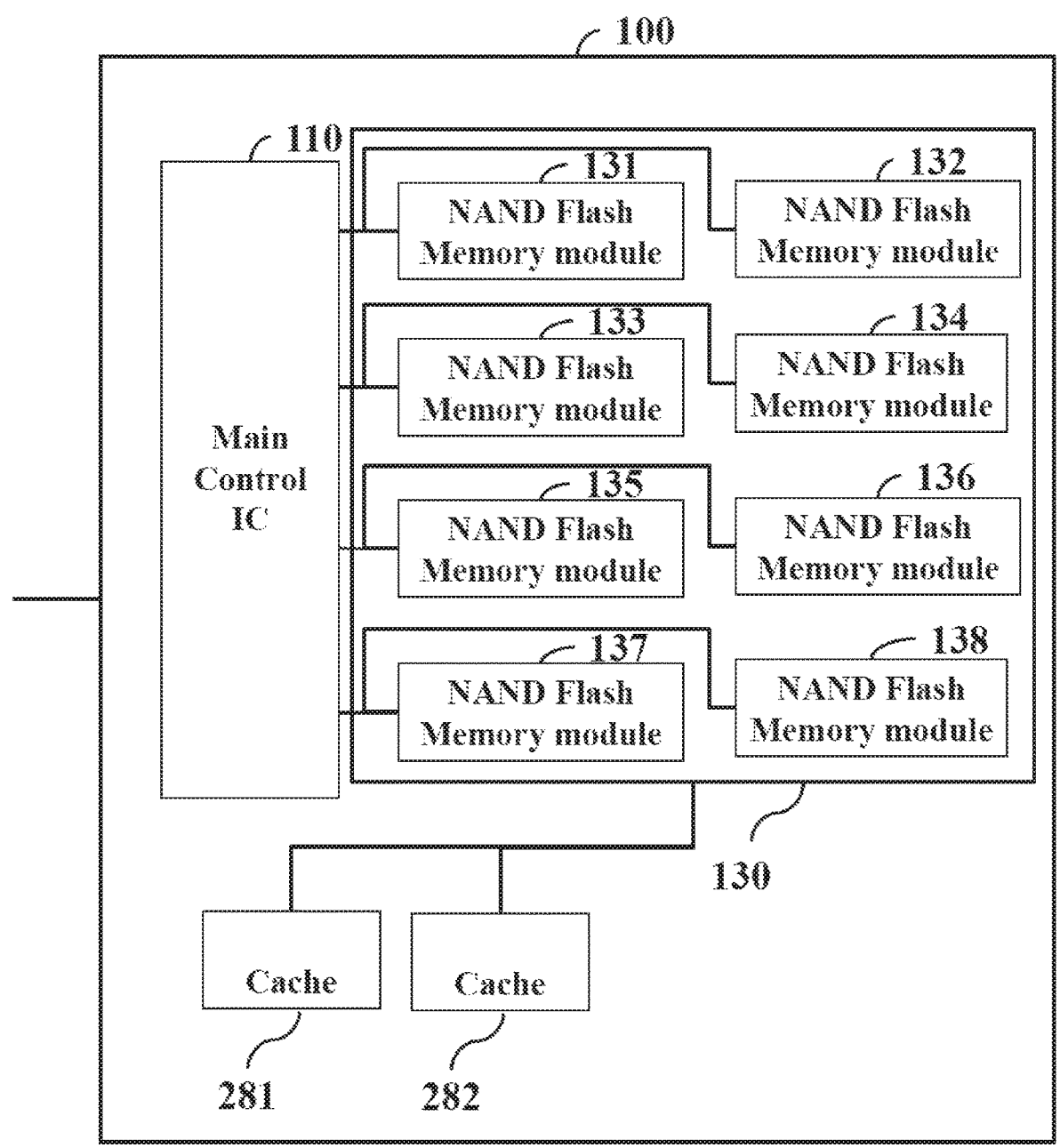
FIG. 1 is a block diagram of a flash memory device of the embodiments of the present disclosure.

The present invention will now be described more fully hereinafter with reference to the accompanying drawings, in which exemplary embodiments of the invention are shown. This present invention may, however, be embodied in many different forms and should not be construed as limited to the embodiments set forth herein. Rather, these embodiments are provided so that this present invention will be thorough and complete, and will fully convey the scope of the present invention to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the invention. This description is made for the purpose of illustration of the general principles of the invention and should not be taken in a limiting sense. The scope of the invention is best determined by reference to the appended claims.

Moreover, the terms "include", "contain", and any variation thereof are intended to cover a non-exclusive inclusion. Therefore, a process, method, object, or device that comprises a series of elements not only include these elements, but also comprises other elements not specified expressly, or may include inherent elements of the process, method, object, or device. If no more limitations are made, an element limited by "include a/an . . . " does not exclude other same elements existing in the process, the method, the article, or the device which comprises the element.

In the following embodiment, the same reference numerals are used to refer to the same or similar elements throughout the invention.

According to the physical characteristics of the flash memory, the present disclosure provides a flash memory to be an intermediate buffer, thereby greatly reducing the use of memory during the RAID operation process and reducing the implementation cost. The redundancy method for the present disclosure is implemented as follows. The cached data is written to the memory array after being processed by the RAID engine, and the operated redundant data would also be written to the memory array.

FIG. 1 is a block diagram of a storage device of the embodiments of the present disclosure. The storage device 100 comprises a memory controller 110 and a non-volatile memory 130 (e.g., NAND memory) comprising a plurality of storage areas 131 to 138. At least one of the storage areas 131 to 138 is configured as a temporary storage area for redundant operations. Storage areas 131 to 138 are flash memory modules. The storage device 100 could be a solid-state disk (SSD), a pen-drive, an SD card, which receives read, write, and erase commands, as well as related parameters and data from the host through an interface). FIG. 1 further comprises caches 281 and 282 as a ping-pong buffer. The ping-pong buffer are read and written alternately.

The memory controller 110 can be connected to multiple memory banks, and each memory bank could comprise multiple storage areas (NAND flash memory modules). For example, the first memory bank comprises storage areas 131 and 132, the second memory bank comprises storage areas 133 and 134, and so forth, so that the storage areas in the same memory bank can share the data line. The memory controller 110 can communicate with the storage areas 131 to 138 by open NAND flash interface (ONFI), Toggle or other communication protocols, to read data from a specific storage area, write data to a specific storage area, or erase data of a specific physical block in a specific NAND flash module. The storage areas 131 to 138 can be made by Intel, Micron, Toshiba, Samsung, or Hynix, providing a large amount of data storage capacity, usually hundreds of gigabytes or even terabytes. The storage areas 131 to 138 can be different types of modules (e.g., single-level cells (SLC), multi-level cells (MLC), three-level cells (TLC), or Quad-level cells (QLC). The storage areas 131 to 138 could be a Single data rate (SDR) memory, a Double data rate 2 (DDR2) memory, or a DDR3 memory, and etc.

Figure 2:
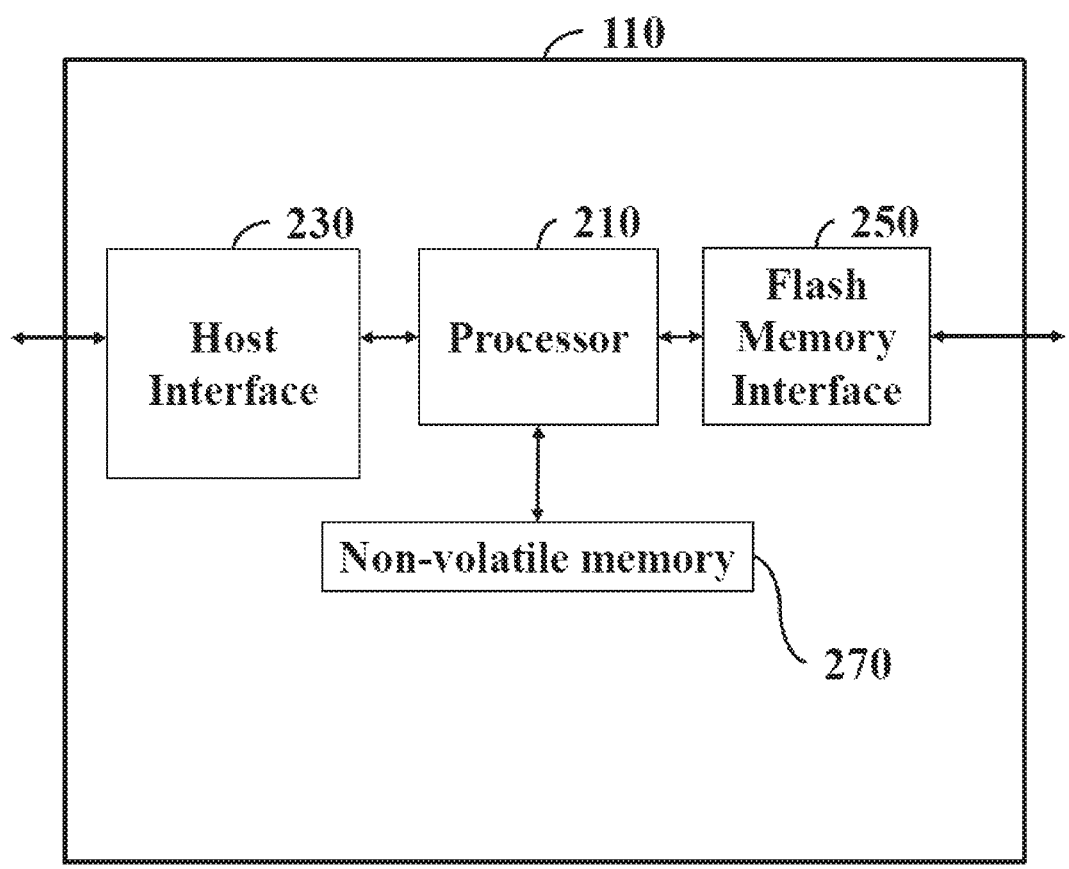
FIG. 2 is a block diagram of a memory controller of the embodiments of the present disclosure.

FIG. 2 is a block diagram of the memory controller of the embodiments of the present disclosure. In embodiments of the present disclosure, the memory controller 110 comprises a processor 210, a host interface 230, a memory interface 250, and a non-volatile memory 270. The non-volatile memory 270 is configured to store program codes for implementing the redundancy method. For example, implementing the method by the read-only memory (ROM), erasable programmable read only memory (EPROM), and electronically erasable programmable read only memory (EEPROM), and etc. The processor 210 could implement the method by general-purpose hardware (for example, a single processor, a multi-processor with parallel processing capabilities, a graphics processor, or other computing-capable processors), and complete the redundancy method described hereafter when loading and executing the program code implementing the redundancy method. The host interface 230 (e.g., serial advanced technology attachment (SATA), peripheral component interconnect express (PCI-E), universal serial bus (USB), and etc.) is coupled to the host. The memory interface 250 is coupled to the storage areas 131 to 138. The processor 210 may communicate with the host through the host interface 230 and access the storage areas 131 to 138 through the memory interface 250. The memory interface 250 includes multiple registers so that the processor 210 can adjust the physical configurations of the flash memory interface 250 by changing the contents of the registers. In another embodiment, the caches 281 and 282 could be disposed in the memory controller 110 and coupled to the processor 210.

In order to overcome the technical issues of implementing the redundant method in flash memory as described above, the non-volatile memory 130 has multiple storage areas and at least one of the multiple storage areas is configured as a temporary storage area for redundant operations. The non-volatile memory 130 comprises multiple storage areas. At least one of the multiple storage areas is configured as a temporary storage area for redundant operations.

The processor 210 is coupled to the non-volatile memory 130 through the memory interface 250. The processor performs redundant operations to a first set of pages stored in one of the plurality of storage areas in the cache to generate an intermediate result of the redundant operation. The processor stores the intermediate result of the redundant operation to the storage area of the at least one temporary storage area for redundant operation from the cache. The processor performs redundant operations to the results of the (m+1)th set of pages stored in one of the plurality of storage areas and the first set of pages stored in the at least one temporary storage area for redundant operation to produce a final result of redundant operations in the cache. The processor stores the final result of the redundant operation to the corresponding pages in the (m+1)th set of pages from the cache. The details are as follows.

Figure 3:
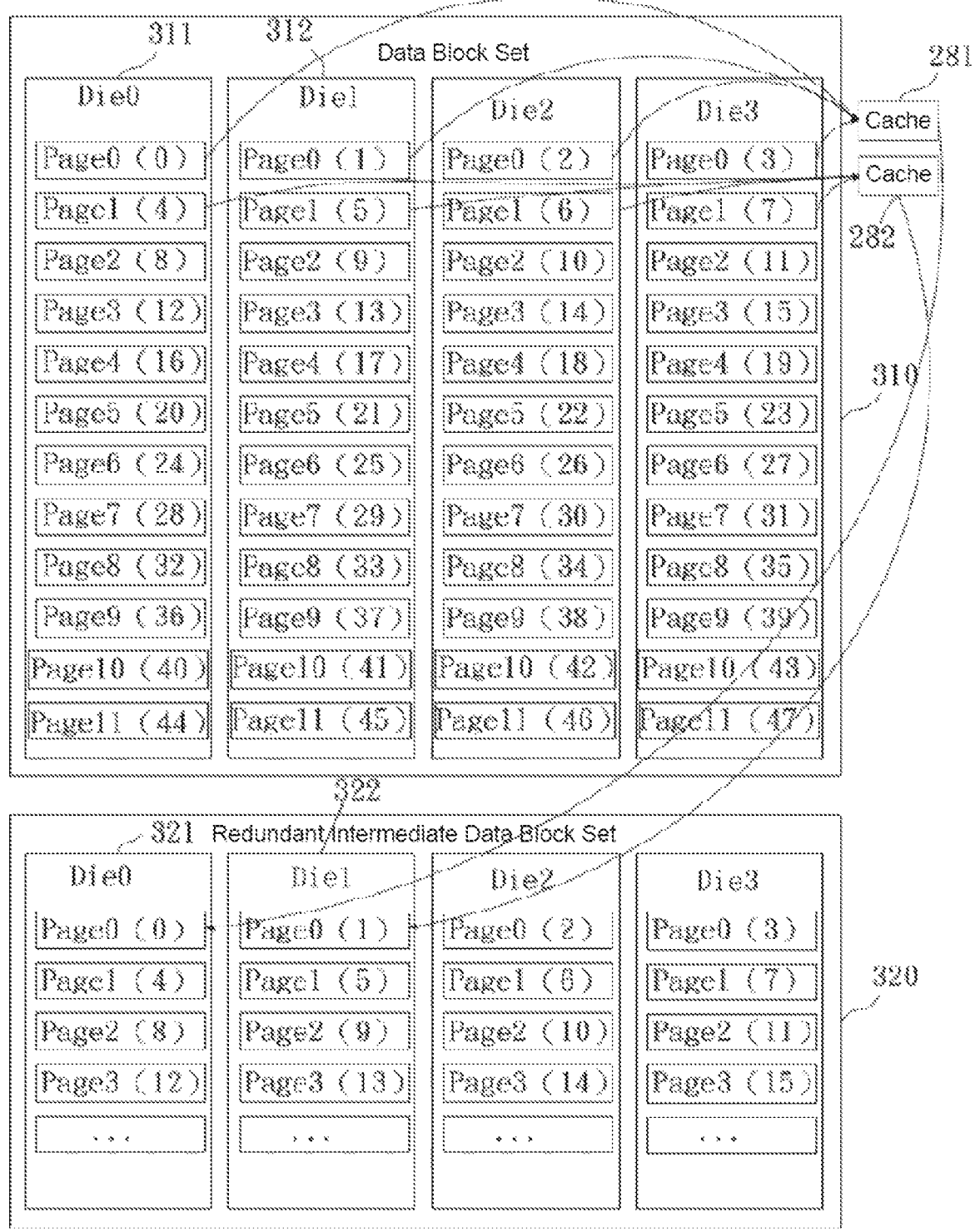
FIG. 3 is a schematic diagram of performing a redundancy method of the embodiments of the present disclosure.
Figure 4:
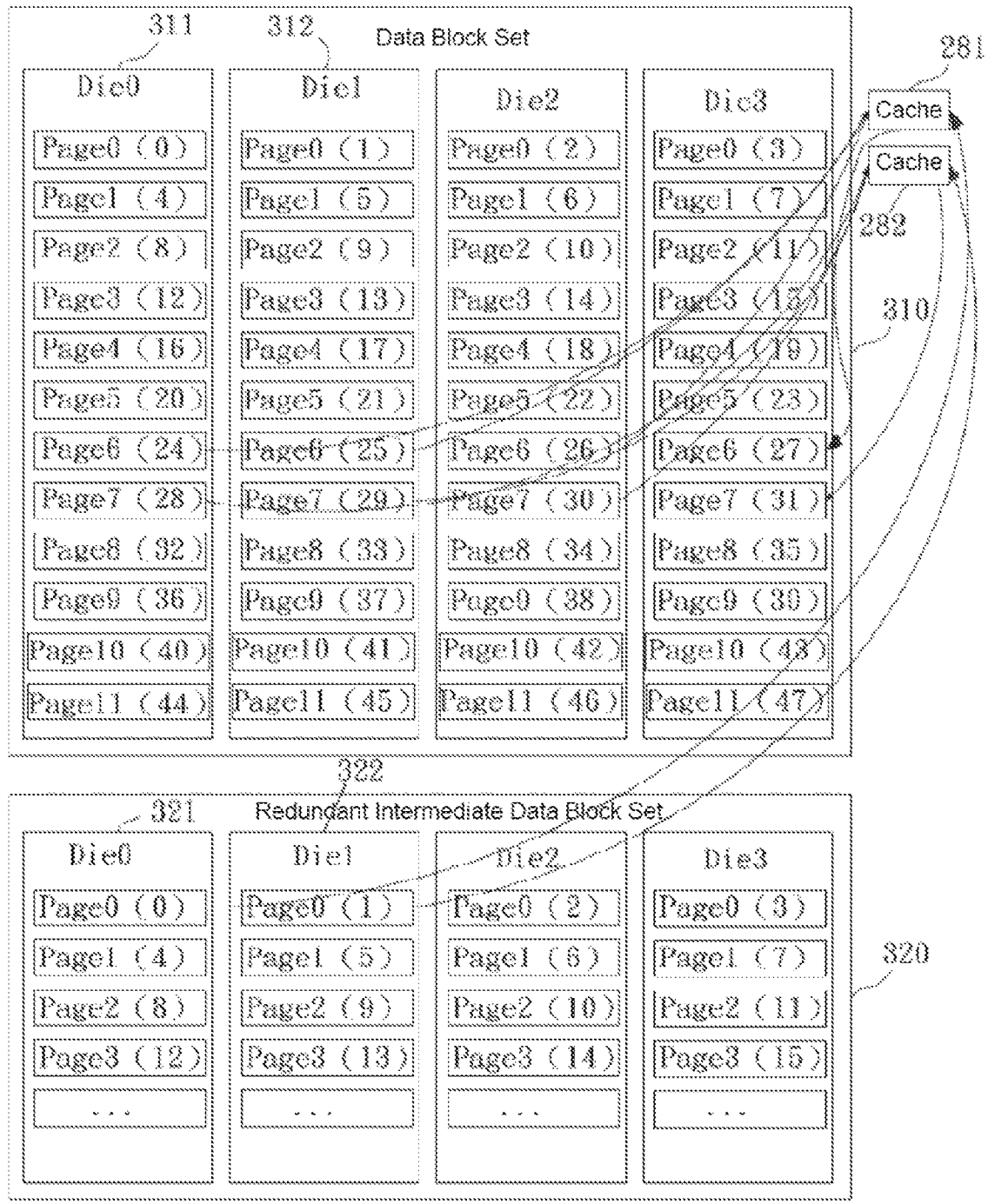
FIG. 4 is another schematic diagram of performing a redundancy method of the embodiments of the present disclosure.

FIG. 3 and FIG. 4 are schematic diagrams of performing a redundancy method of the embodiments of the present disclosure. As shown in the figures, the non-volatile memory is divided into two storage areas, and the storage areas 310 and 320 are taken as examples for description. In an embodiment, storage area 310 is a set of NAND data blocks for storing data from the host, and storage area 320 is a set of NAND redundant intermediate data blocks for temporarily storing intermediate data in a redundant operation process and/or storing data after the redundant operation is completed. Take the figure as an example, there are 4 Dies in the system, Die0 to Die3, and each Die comprises 12 pages, page0 to page11. All blocks of the 4 Dies are divided into two block sets, namely the data block set 310 and the redundant intermediate data block set 320. Caches 281 and 282 are also shown in FIG. 3 as a ping-pong buffer (also called double buffers) and the processor 210 performs a redundant operation (e.g., exclusive OR operations) via Caches 281 and 282. The program sequence of the data block set 310 and the redundant intermediate data block set 320 is shown by the numbers in parentheses after the page in the figure.

The processor 210 performs a redundant operation to the first set of pages stored in the storage area 310 to generate an intermediate result of the redundant operation. Each page in the first set of pages performs the redundant operation based on a predetermined order. The processor 210 stores the intermediate result of the redundant operation to the storage area 320 of the at least one temporary storage area for redundant operation from the cache 281. The intermediate result of the redundant operation is stored based on a predetermined page order. In this way, the processor 210 performs a redundant operation on page 0 of Die0 to Die3 (that is, each page in the first set of pages) in the storage area 310. The generated redundant operation intermediate result is firstly stored in the cache 281, and the cache 281 stores the redundant operation intermediate result to the page 0 of Die0 of the storage area 320 from the cache 281. Then the processor 210 performs redundant operations to Page 1 of Die0 to Die3 (that is, each page in the second set of pages). The generated redundant operation intermediate result is stored in the cache 282, and the cache 282 stores the intermediate result of the redundant operation to page 1 of Die0 of the storage area 320 from the cache 282. In another embodiment, the cache 281 stores the intermediate results of the redundant operations to page 0 of Die0 in the storage area 320 performs redundant operations to page 1 to Die0 to Die3 of the storage area 310, and the intermediate result of the redundant operation is stored in the cache 282 at the same time.

In one embodiment of the present disclosure, to the first set of pages in one of the plurality of storage areas the processor performs a redundant operation which is an exclusive OR operation; to the (m+1)th set of pages in one of the plurality of storage areas the processor performs a redundant operation which is an exclusive OR operation. In one embodiment of the present disclosure, the operation results of the first set of pages and the operation result of the (m+1)th set of pages are stored in order in the storage area of the at least one temporary storage area for redundant operation. In one embodiment of the present disclosure, the exclusive OR operation is determined based on the number of DIE of the storage area.

Then, the processor 210 performs redundant operations to the results of the (m+1)th set of pages stored in one of the plurality of storage areas and the first set of pages stored in the at least one temporary storage area for redundant operation to produce a final result of redundant operations. That is, the processor 210 performs redundant operations to page 6 of Die0 to Die2 of the storage area 310 and to page 0 of Die0 of the storage area 320 to generate the final result of the redundant operation. The processor 210 performs redundant operations to page 7 of Die0 to Die2 of the storage area 310 and to page 0 of Die1 of the storage area 320 to generate the final result of the redundant operation.

Next, the processor 210 stores the final result of the redundant operation to corresponding pages in the (m+1)th set of pages from the cache. That is, the final result of the redundant operation of page 6 of Die0 to Die2 of the storage area 310 and page 0 of Die0 of the storage area 320 is stored to page 6 of Die3 from the cache 281; the redundant operation results of page 7 of Die0 to Die2 of the storage area 310 and page 0 of Die1 of the storage area 320 are stored to Page 7 of Die3 from the cache 282. In another embodiment, the storing of the final result of the redundant operation to page 6 of Die 3 of the storage area 310 from the cache 281 and the temporary storing of the final result of the redundant operations to page7 of Die0 to Die2 of the storage area 310 and to page 0 of Die1 of the storage area 320 to the cache 282 are performed simultaneously.

Figure 5:
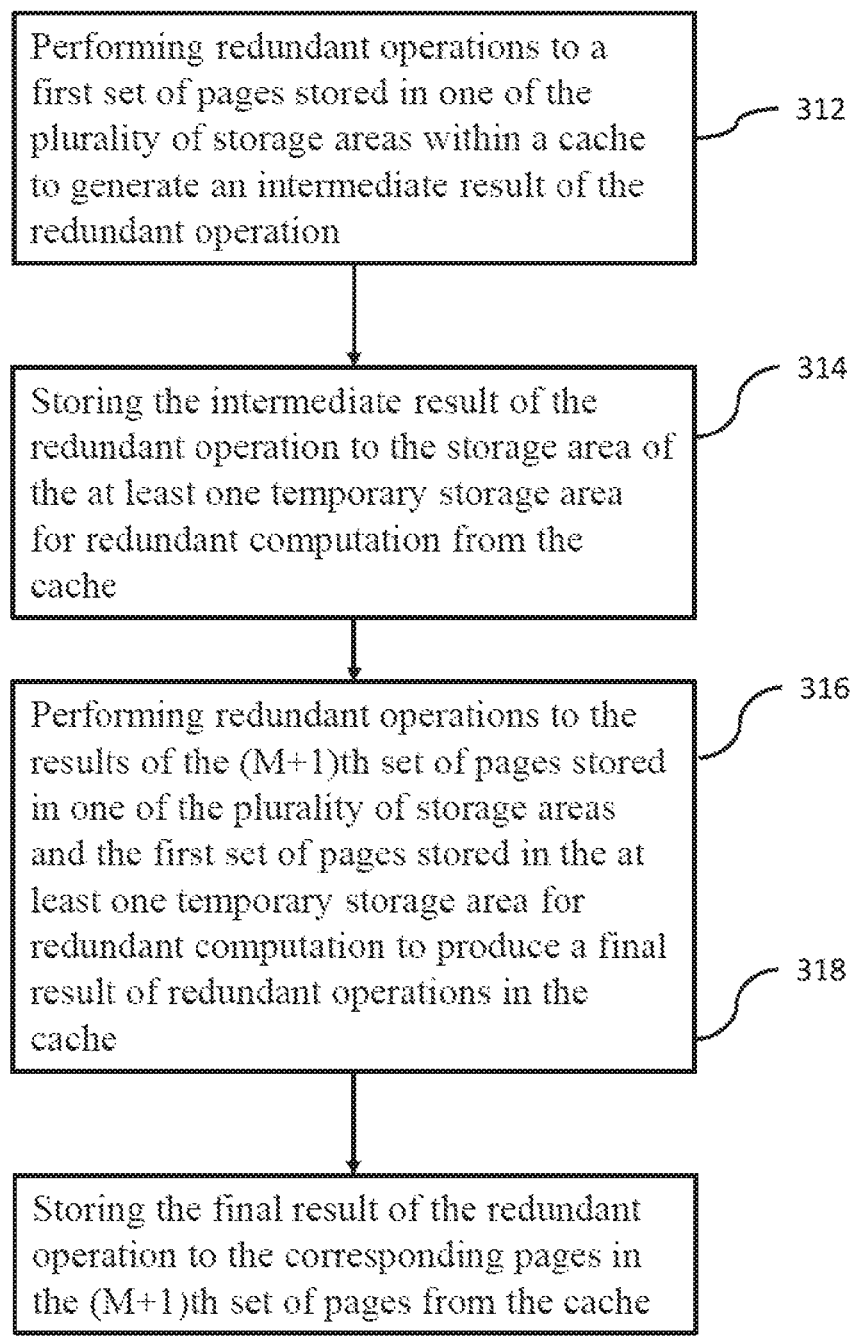
FIG. 5 is a flowchart of performing a redundancy method of the embodiments of the present disclosure.

Finally, until the final results of all redundant operations are stored in the data block set 310, the redundant intermediate data block set 320 can be erased. The method implemented when the processor 210 loads and executes the program code of the redundancy method can be referred to as the flowchart shown in FIG. 5. The details are as follows.

Step S312: perform redundant operations to a first set of pages stored in one of the plurality of storage areas in a cache to generate an intermediate result of the redundant operation.

In one embodiment of the present disclosure, each page of the first set of pages performs the redundant operation based on a predetermined order.

In one embodiment of the present disclosure, the redundant operation is an exclusive OR operation performed to the first set of pages in the step of performing redundant operations to the first set of pages in one of the plurality of storage areas. The redundant operation is an exclusive OR operation performed to the (m+1)th set of pages in the step of performing redundant operations to the (m+1)th set of pages in one of the plurality of storage areas.

In one embodiment of the present disclosure, the exclusive OR operation is determined based on the number of DIE of the storage area.

Step S314: store the intermediate result of the redundant operation from the cache to a storage area of the at least one temporary storage area for redundant operation.

In one embodiment of the present disclosure, the intermediate result of the redundant operation is stored based on a predetermined page order in the step of storing the intermediate result of the redundant operation to the storage area of the at least one temporary storage area for redundant operation from the cache.

In one embodiment of the present disclosure, the operation results of the first set of pages and the operation result of the (m+1)th set of pages are stored in order in the storage area of the at least one temporary storage area for redundant operation.

Step S316: perform redundant operations to the results of the (m+1)th set of pages stored in one of the plurality of storage areas and the first set of pages stored in the at least one temporary storage area for redundant operation to produce a final result of redundant operations in the cache.

Step S318: store the final result of the redundant operation to the corresponding pages in the (m+1)th set of pages from the cache.

The intermediate result temporary block set 320 can be used in order until the last page, and the data of the page is eliminated after use. Therefore, it will not occupy the over provisioning (OP) of the flash memory device.

In this way, in the case of using two caches, it can be guaranteed that pages with a certain probability to be damaged at the same time will not participate in the redundant operation of the same set. Among the RAID with (M*N−1)+1 set completed, the "N" is the number of Die and the "M" is the number of sets of the page that can be adjusted. In addition, the method of the present disclosure can also adjust the page algorithm participating in RAID to ensure the data recovery probability and can adjust the operating mode of RAID to control the OP ratio.

In one embodiment of the present disclosure, the total capacity of the caches 281 and 282 need not be larger than the amount of the data of the 2 pages in one of the plurality of storage areas.

All or part of the steps of the method described herein can be implemented by computer programs, such as an operating system of a computer, a driver of specific hardware in a computer, or a software program. In addition, other types of programs, as shown above, can also be implemented. Those skilled in the art can write the method of the embodiment of the present disclosure into a program, which will not be described here. The programs implemented in accordance with the method of the embodiments of the present disclosure may be stored in a suitable computer-readable data carrier, such as a DVD, a CD-ROM, a USB, a hard disk, or a network-accessible (e.g. the Internet, or other suitable carriers) webserver.

In summary, according to the present invention, a redundancy method applied to a flash memory storage device and a flash memory storage device use non-volatile memory as an intermediate buffer, so that a large amount is not required during a RAID operation. The cached data can greatly reduce the use of memory (SRAM) while taking into account data recovery capabilities, thereby greatly reducing the cost of implementing RAID. Furthermore, according to the present invention, a redundancy method and a flash memory storage device can perform the redundant operation with variable number of pages.

It is to be understood that the term "comprises", "comprising", or any other variants thereof, is intended to encompass a non-exclusive inclusion, such that a process, method, article, or device of a series of elements not only include those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present invention has been explained in relation to its preferred embodiment, it does not intend to limit the present invention. It will be apparent to those skilled in the art having regard to this present invention that other modifications of the exemplary embodiments beyond those embodiments specifically described here may be made without departing from the spirit of the invention. Accordingly, such modifications are considered in the scope of the invention as limited solely by the appended claims.

What is claimed is:

1. A redundancy method for a flash memory device, wherein the flash memory device comprises a plurality of storage areas in which at least one storage area is configured as a temporary storage area for redundant operation with multiple pages; the method comprising:
    performing a redundant operation to a first set of pages stored in one of the plurality of storage areas in a cache to generate an intermediate result of the redundant operation;
    storing the intermediate result of the redundant operation to the storage area of the at least one temporary storage area for redundant operation from the cache;
    performing redundant operations to the (m+1)th set of pages stored in one of the plurality of storage areas and the redundant operation result of the first set of pages stored in the at least one temporary storage area for redundant operation to produce a final result of redundant operations in the cache; and
    storing the final result of the redundant operation to the corresponding pages in the (m+1)th set of pages from the cache.

2. The redundancy method according to claim 1, wherein in the step of performing the redundant operation to the first set of pages in one of the plurality of storage areas, the redundant operation of each page in the first set of pages is performed according to a predetermined order.

3. The redundancy method according to claim 1, wherein in the step of storing the intermediate result of the redundant operation to the storage area of the at least one temporary storage area for redundant operation from the cache, the intermediate result of the redundant operation is stored based on a predetermined page order.

4. The redundancy method according to claim 1, wherein in the step of performing redundant operations to the first set of pages in one of the plurality of storage areas, the redundant operation is an exclusive OR operation performed to the first set of pages; in the step of performing redundant operations to the (m+1)th set of pages in one of the plurality of storage areas, the redundant operation is an exclusive OR operation performed to the (m+1)th set of pages.

5. The redundancy method according to claim 4, wherein the exclusive OR operation is determined based on the number of DIE of the storage area.

6. The redundancy method according to claim 1, wherein the operation results of the first set of pages and the operation result of the (m+1)th set of pages are stored in order in the storage area of the at least one temporary storage area for redundant operation.

7. The redundancy method according to claim 1, wherein the total capacity of the cache is not greater than the capacity of two pages of the storage area.

8. The redundancy method according to claim 1, wherein the flash memory device performs the redundant operation with variable number of pages.

9. A flash memory device, comprising:
   a cache;
   a non-volatile memory comprising multiple storage areas, wherein at least one multiple storage areas is configured as a temporary storage area for redundant operation with multiple pages;
   a processor coupled to the non-volatile memory, wherein the processor:
      performs a redundant operation to a first set of pages stored in one of the plurality of storage areas in the cache to generate an intermediate result of the redundant operation;
      stores the intermediate result of the redundant operation to the storage area of the at least one temporary storage area for redundant operation from the cache;
      performs redundant operations to the (m+1)th set of pages stored in one of the plurality of storage areas and the redundant operation result of the first set of pages stored in the at least one temporary storage area for redundant operation to produce a final result of redundant operations in the cache; and
      stores the final result of the redundant operation to the corresponding pages in the (m+1)th set of pages from the cache.

10. The flash memory device according to claim 9, wherein the redundant operation of each page in the first set of pages is performed according to a predetermined order.

11. The flash memory device according to claim 9, wherein the intermediate result of the redundant operation is stored based on a predetermined page order.

12. The flash memory device according to claim 9, wherein the redundant operation is an exclusive OR operation performed to the first set of pages; wherein the redundant operation is an exclusive OR operation performed to the (m+1)th set of pages.

13. The flash memory device according to claim 12, wherein the exclusive OR operation is determined based on the number of DIE of the storage area.

14. The flash memory device according to claim 9, wherein the operation results of the first set of pages and the operation result of the (m+1)th set of pages are stored in order in the storage area of the at least one temporary storage area for redundant operation.

15. The flash memory device according to claim 9, wherein the flash memory device performs the redundant operation with variable number of pages.

* * * * *